United States Patent [19]

Colliaux

[11] 4,440,475

[45] Apr. 3, 1984

[54] ELECTRON PROBE MICROANALYZER COMPRISING AN OBSERVATION SYSTEM HAVING DOUBLE MAGNIFICATION

[75] Inventor: Daniel Colliaux, Courbevoie, France

[73] Assignee: Compagnie d'Applications Mecaniques a l'Electronique, au Cinema et a l'Atomistique (C.A.M.E.C.A.), Courbevoie, France

[21] Appl. No.: 339,995

[22] Filed: Jan. 18, 1982

[30] Foreign Application Priority Data

Jan. 23, 1981 [FR] France ............................... 80 01289

[51] Int. Cl.³ .............................................. G02B 21/18
[52] U.S. Cl. .................................... 350/502; 350/511; 350/525; 350/526; 350/257; 250/310
[58] Field of Search ............... 350/511, 502, 505, 513, 350/515, 525, 526, 527, 507, 537; 250/310

[56] References Cited

FOREIGN PATENT DOCUMENTS 224359 11/1962 Austria ................................ 350/511
2173436 10/1973 France ................................ 350/505

OTHER PUBLICATIONS

G. A. Leavitt, "An Instrument", *Advances in Instrumentation*, vol. 29, Part 2, pp. 1–7.

*Primary Examiner*—Jon W. Henry

[57] ABSTRACT

The electromagnetic lens for focusing the analyzing electron beam is provided with a central channel along the axis of the electron beam which is intended to pass through a mirror-objective having high magnification. The electromagnetic lens further comprises a lateral channel in which is placed an auxiliary objective having low magnification. An optical illumination system, the axis of which is contained in the plane of the axes of the objectives, illuminates the sample either through the principal objective or through the auxiliary objective. An orientable mirror which is orthogonal to the plane aforesaid and placed at the intersection of the beams which form the images through the two objectives permits the use of the same observation means both for low magnification and for high magnification.

6 Claims, 3 Drawing Figures

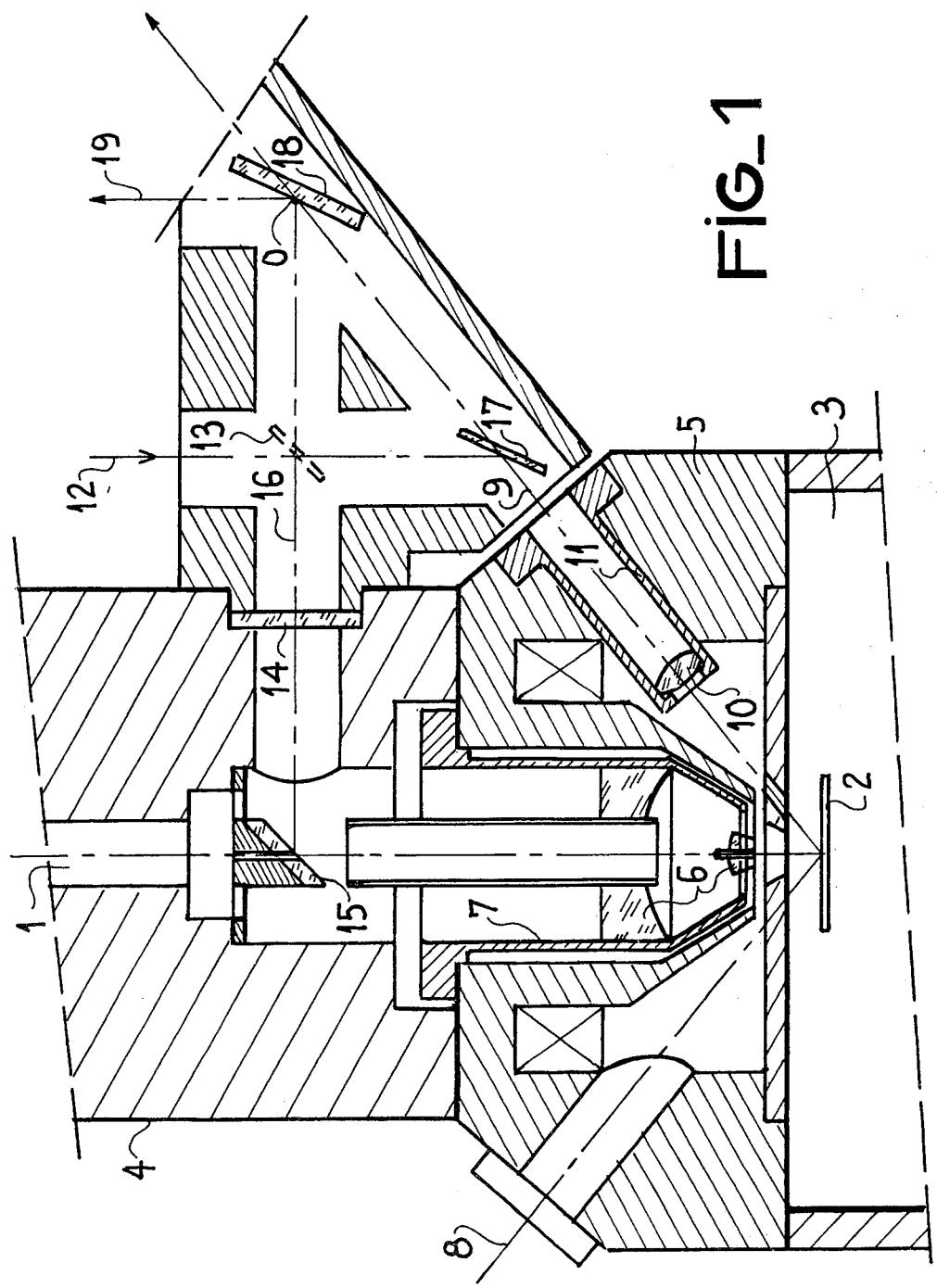

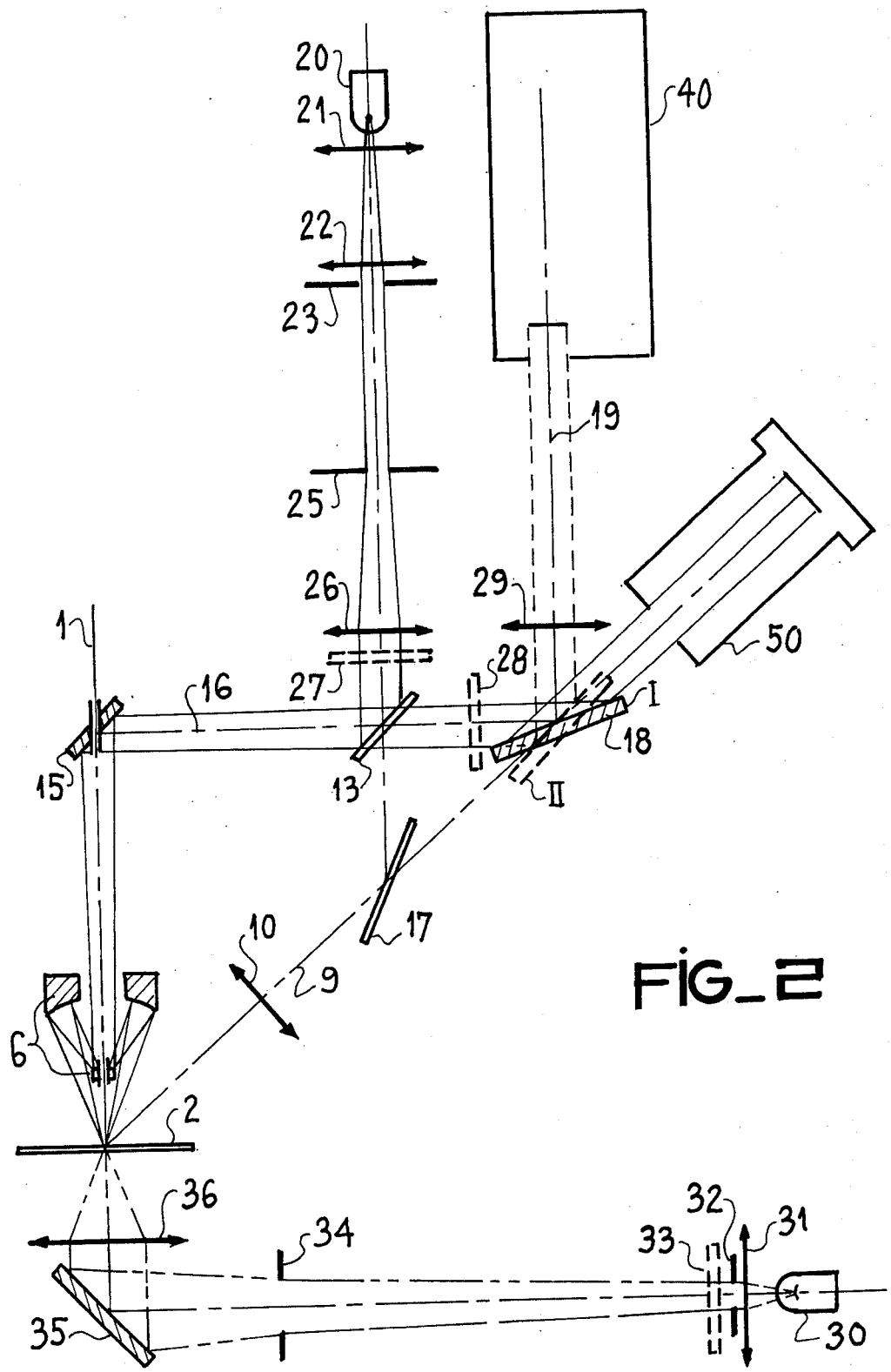
FIG_2

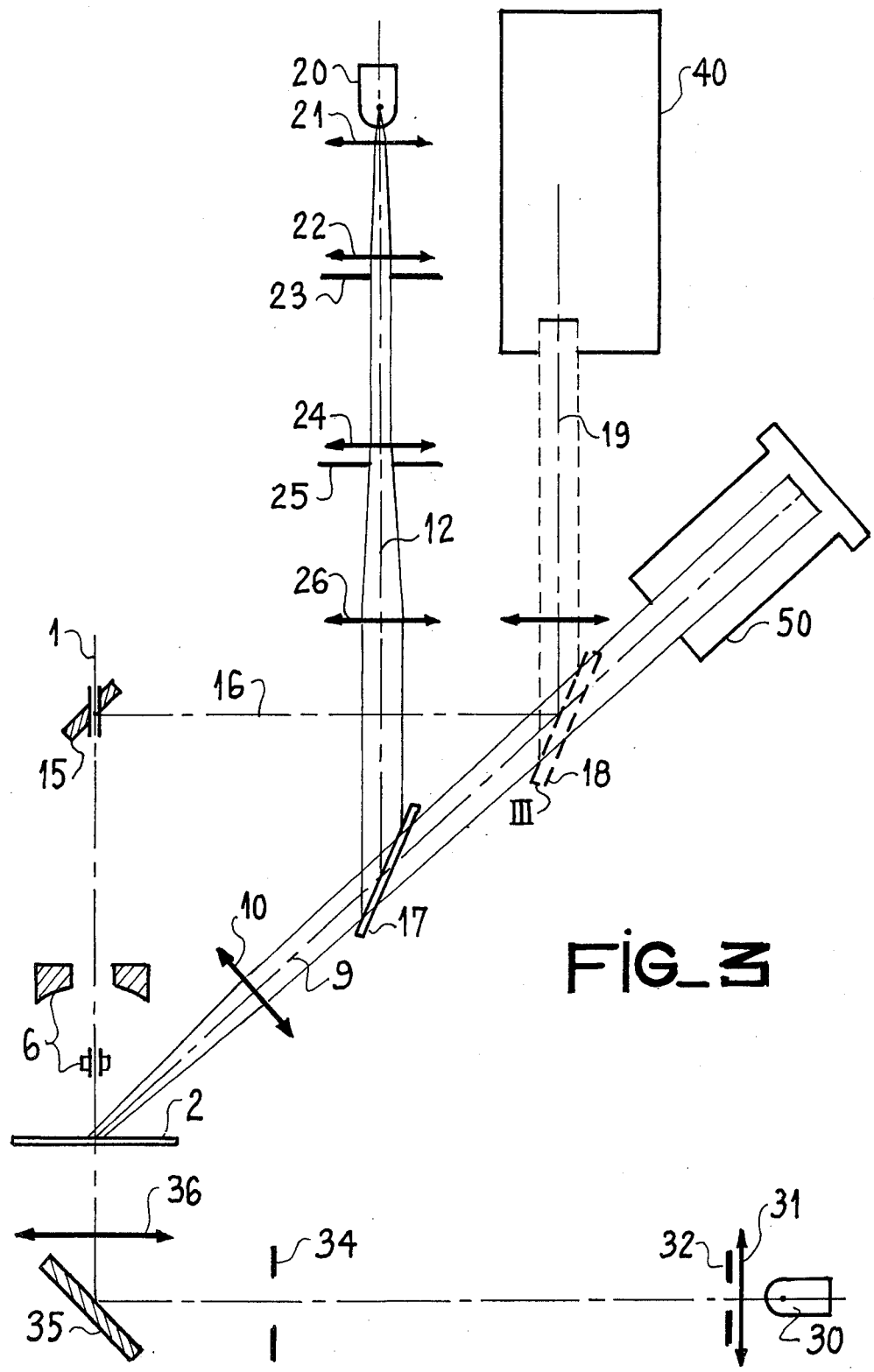
FIG_3

ELECTRON PROBE MICROANALYZER COMPRISING AN OBSERVATION SYSTEM HAVING DOUBLE MAGNIFICATION

This invention relates to electron probe microanalyzers and is more particularly concerned with a microanalyzer of this type in which provision is made for a double-magnification observation system.

For the analysis of samples by X-ray spectrometry, an optical microscope having high magnification and a small depth of field is associated with the electron probe in order to effect accurate positioning of the zone to be analyzed under electron-beam excitation. This optical microscope is equipped with a mirror objective having the same axis as the electron beam.

It is also desirable, however, to provide the possibility of preliminary location of the sample zone to be analyzed by means of an optical microscope having low magnification but a larger field of the order of a few millimeters.

In optical equipment, double-magnification systems comprising turrets which carry a number of objectives are already known. Rotation of the turret makes it possible by changing the objective to modify the magnification and the depth of field.

A solution of this kind is not applicable in a microanalyzer by reason of the fact that the objective of the high-magnification optical microscope is surrounded by the electromagnetic lens in which the electron beam is focused. Another solution would accordingly consist in constructing the low-magnification optical microscope coaxially with respect to the high-magnification optical microscope. This solution is not feasible in practice, however, since the field would be limited among other things by the central aperture of the convex mirror-objective of the high-magnification microscope.

The aim of the invention is to provide an electron probe microanalyzer comprising an observation system for obtaining either of two magnifications from a single observation plane and along two different optical paths. The first magnification is employed for rough location of a predetermined zone of a sample to be analyzed and the second magnification is employed for accurate positioning of the zone to be bombarded with the electron beam. Switching is carried out by means of a single mechanical control device.

In accordance with the invention, an electron probe microanalyzer for analyzing a sample by means of an electron beam, comprising an electromagnetic lens provided with a central channel, for focusing the electron beam, and provided with lateral channels, said microanalyzer being equipped with a system for observing the sample to be analyzed, wherein said system comprises a high-magnification mirror-objective placed within said central channel, a stationary device for producing an illuminating beam for illumination of the sample through said objective and associated stationary observation means, an auxiliary objective having lower magnification than the first and placed in one of said lateral channels, and a mechanically-controlled optical device for directing said illuminating beam to either of the two objectives and for directing the return beam from the objective employed to the stationary observation means.

Other features of the invention will be more apparent upon consideration of the following description and accompanying drawings, wherein:

FIG. 1 is a sectional view of the central portion of the microanalyzer according to the invention;

FIGS. 2 and 3 show the optical systems respectively at the time of an observation carried out with high magnification and at the time of an observation carried out with low magnification.

As a general rule, microanalyzers are provided with passages or "channels" which are inclined with respect to the axis of the electron beam. These channels serve to detect the signals resulting from X-ray secondary emission and especially electrons. In order to reduce the effects of self-absorption of X-radiation by the sample, it is an advantage to ensure that the angle between the axis of the channel and the surface of the sample is not too small. Typically, this angle is in the vicinity of 45° in modern microanalyzers.

In order to house a low-magnification auxiliary objective, the observation system provided in the microanalyzer according to the invention makes use of a channel which is identical with those employed for detecting secondary signals.

The optical illumination system is chosen so as to ensure that the maximum number of optical elements are common to the high-magnification observation system and to the low-magnification auxiliary observation system.

FIG. 1 illustrates the central portion of the microanalyzer in which the axis 1 is the axis of the electron beam which is intended to impinge upon the sample 2. This electron beam is accelerated within a vacuum enclosure 3, seals being provided at the limits of said enclosure, part of which is shown in FIG. 1. The sample is placed within said enclosure 3. The body of the electron probe 4 terminates in an electromagnetic lens 5 which is intended to focus the electron beam on the sample 2. Said electromagnetic lens 5 is provided with a central channel having the same axis as the electron beam, said channel being intended to house the mirror-objective 6 which is fixed on a support 7.

Provision is made for lateral channels, two of which are shown in FIG. 1. One lateral channel is intended to be employed for detecting secondary emission and has an axis 8 whilst the other has an axis 9 and houses the objective 10 of the low-magnification optical microscope. Said objective 10 is mounted in a support 11 which is housed within said channel.

The illumination system for observation at either of the two magnifications is represented in FIG. 1 only by its axis 12.

The observation system comprises within the body of the microanalyzer a retractable semitransparent plate 13 which is placed at an angle of 45° with respect to the axis 12. When said semireflecting plate is present on the path of the beam, said beam which is reflected from said plate passes through a transparent plate 14 which limits the vacuum enclosure and is reflected from a mirror 15 which is oriented at 45° with respect to the axis 1 of the electron beam and with respect to the axis 16 of the beam reflected from the semireflecting plate 13. The axis of the beam reflected from said mirror 15 is the axis 1.

Said reflected beam is focused on the sample 2 by means of the objective 6 which comprises a convex mirror and a concave mirror forming an assembly of the Cassegrain type. The retractable semitransparent plate 13 is shown in dashed outline in FIG. 1 since it is present on the path of the illumination beam only at the time of an observation performed with high magnification.

When carrying out an observation with low magnification, the illumination beam having an axis 12 is reflected from a semitransparent plate 17 which returns the beam along the axis 9 in the direction of the sample 2 through the objective 10.

The light which is intended to permit observation is the light transmitted by either of the two semitransparent plates 13 and 17, depending on the mode of observation chosen. These two transmitted beams have axes 16 and 9 which are separate and distinct from each other. Said two axes intersect at a point 0, and an orientable and retractable mirror 18 mounted for pivotal displacement about said point 0 is placed on the path of the return beams. The orientation of said mirror 18 makes it possible to choose for one of the two modes of observation either the binocular magnifier located on the axis of the beam 9 or a television camera located on an axis 19 which is orthogonal to the axis 16.

FIG. 1 shows said orientable mirror 18 in the position required for low-magnification observation by the television camera.

The illumination system is shown only in FIGS. 2 and 3 which illustrate the optical observation at the time of an observation performed with high magnification and at the time of an observation performed with low magnification. This illumination system comprises the same elements for both modes of operation, with the exception of one lens.

In FIG. 2, the illumination system comprises a source 20 associated with a collecting lens 21. This lens projects the enlarged image of the source 20 onto an aperture diaphragm 23. This image is formed in the exit pupil of the mirror-objective 6 by means of a field lens 26. The field diaphragm 25 is projected in the conjugate image plane of the mirror-objective 6 by said field lens 26. Said field diaphragm 25 is placed on the optical path in such a manner as to be associated in conjugate relation with the collecting lens 21 by the aperture lens 22.

The zone of the sample 2 which is thus illuminated can be observed either by means of a binocular magnifier 50 or by means of a television camera 40. To this end, the image of the illuminated zone is formed in either of two observation planes, depending on the position of the orientable mirror 18 which receives the return beam transmitted by the semitransparent plate 13. The projection objective 29 placed on the axis of the camera adapts the dimensions of the projected image to those of the camera tube.

The observation system described in the foregoing going is readily applicable to the observation of reflection-polarized light. To this end, a polarizer 27 shown in dashed outline in FIG. 2 can be placed on the optical path downstream of the field lens 26. An analyzer 28 is placed on the path of the return beam downstream of the semireflecting plate 13. Said analyzer 28 is also shown in dashed outline in FIG. 2.

The polarizer 27 and the analyzer 28 are coupled mechanically in rotation about axes 12 and 16 respectively. Observation in reflection-polarized light can be performed as in the first case either by means of the binocular magnifier 50 or by means of the television camera 40.

Another system of illumination of the sample 2 is possible; this system permits observation in polarized light by transmission with high magnification exactly as in the case of observation in reflection with high magnification. The corresponding optical path is shown in dashed lines in FIG. 2. This different system of illumination comprises a source 30 with which is associated a collecting lens 31 followed by a field diaphragm 32. A polarizer 33 follows said field diaphragm 32 on the optical path and an aperture diaphragm 34 precedes a mirror 35 which directs the light onto the object 2. The axis of the source 30 chosen in FIG. 2 is parallel to the plane of the sample and perpendicular to the plane containing the axes 1, 9 and 16. The beam reflected from the mirror 35 is directed towards the sample 2 through a condensing lens 36. Thus, said lens 36 forms the image of the field diaphragm 32 on the sample 2. The enlarged image of the filament of the source 30 is projected by the collecting lens 31 in the plane of the aperture diaphragm 34 of the condensing lens 36. The polarizer 33 and the analyzer 28 which are placed on the path of the beam transmitted by the sample 2 to the observation elements 40 or 50 are coupled mechanically as in the first case. Observation is carried out as before, either by means of the binocular magnifier 50 or by means of the television camera 40.

When considered alone, the system described in FIG. 2 and corresponding to observation with high magnification does not constitute an original concept. However, the combination of said system with an observation system with lower magnification in which the majority of components are taken from the first system makes it possible to solve the problem mentioned in the introductory part of this specification.

The observation system aforesaid is illustrated in FIG. 3 in which the same elements are designated by the same references.

The illumination system which is solely intended for observation by reflection from the sample 2 is the same as the system for observation by reflection with high magnification, with the exception of one lens. However, this system further comprises a field lens 24 which precedes the diaphragm 25 on the optical path of the beam. The low-magnification illumination system is completed by the semitransparent plate 17 since the semitransparent plate 13 has been removed from the optical path in this mode of observation. The beam reflected from said semitransparent plate 17 is transmitted to the sample 2 along the optical axis 9 through the objective 10.

The optical elements thus described are placed with respect to each other in such a manner as to ensure that the illumination system operates as follows: the collecting lens 21 projects the enlarged image of the filament of the source 20 on the aperture diaphragm 23. The image of said aperture diaphragm 23 is formed on the objective 10 by the field lens 26 associated with the additional field lens 24. The field diaphragm 25 is projected through the field lens 26 in the conjugate image plane of the objective 10. The field diaphragm 25 is associated in conjugate relation with the collecting lens 21 by the aperture lens 22.

In one embodiment of the observation system, the diameter of the illuminated field on the sample 2 at high magnification is of the order of 500 micrometers. The mirror-objective 6 produces an image of said object which is enlarged forty times and therefore has a diameter of 20 mm. This image is transferred to the binocular magnifier by eyepiece lenses having a magnification of 10X, the high magnification being therefore equal to 400X.

For the purposes of observation with low magnification, the field observed on the sample 2 has a diameter of the order of 5 mm. The objective 10 produces an image of said object which is enlarged only four times, then transferred as in the first observation system by the 10X-magnification eyepiece lenses of the binocular magnifier, the high magnification being therefore equal to 40X.

The enlargements produced by these two observation systems are therefore in a ratio of 1:10.

By reason of the fact that illumination of the sample 2 takes place along an axis which is oblique with respect to the normal to the plane of the sample, the image is not formed exactly in the observation plane at right angles of the axis 9 but this is not of great importance since this mode of observation does not call for a high degree of accuracy.

In comparison with conventional systems which provide only a single magnification, the double-magnification observation system described in the foregoing consequently makes it necessary to provide in addition to the optical elements employed in the prior art only an additional retractable lens 24, an objective 10, a semi-transparent plate 17 and a mechanical control device (not shown in the figures) which produces simultaneous action on all the optical elements designed specifically for each mode of observation. In the case of observation with high magnification, said mechanical control device withdraws the lens 24 whereas, in the case of observation with low magnification, said control device places the lens 24 on the path of the beam and withdraws the semitransparent plate 13.

Any one of four positions of the mirror 18 can be chosen. The first two positions I, II shown in FIG. 2 correspond to high-magnification observation carried out respectively by means of the binocular magnifier 50 and by means of the television camera 40. The other two positions are the position III shown in FIG. 3 for observation with low magnification by means of the camera 40, and an additional position in which the mirror 18 is withdrawn for low-magnification observation by means of the binocular magnifier.

The invention is not limited to the embodiment which has been specifically described and illustrated in the foregoing.

In particular, the illumination system can be modified and different observation means may be provided for analysis of the observed images.

What is claimed is:

1. An electron probe microanalyzer, for analyzing a sample by means of an electron beam, comprising an electromagnetic lens provided with a central channel, for focusing the electron beam and provided with lateral channels, said microanalyzer being equipped with a system for observing the sample to be analyzed, wherein said system comprises a high-magnification mirror-objective placed within said central channel, a stationary device for producing an illuminating beam for illumination of the sample through said objective and associated stationary observation means, an auxiliary objective having lower magnification than the first and placed in one of said lateral channels, and a mechanically-controlled optical device for directing said illuminating beam to either of the two objectives and for directing the return beam from the objective employed to the stationary observation means.

2. A microanalyzer according to claim 1, wherein the mechanically-controlled optical device comprises two semitransparent plates on the axis of the illuminating beam, said illuminating beam being returned to the high-magnification objective by the first semitransparent plate and being returned to the auxiliary objective by the second semitransparent plate, said first plate being withdrawn during observation with low magnification.

3. A microanalyzer according to claim 2, wherein the mechanically-controlled optical device further comprises an orientable mirror for directing the return beam from the objective employed to the observation means.

4. A microanalyzer according to claim 3, wherein the observation means comprise a binocular magnifier and a camera, the orientable mirror being provided with four positions for directing the return beam from either of the two objectives to said magnifier or to said camera.

5. A microanalyzer according to claim 4, in which the axis of the illuminating beam is parallel to the axis of the central channel, the first semitransparent plate being oriented at an angle of 45° with respect to the axis of the illuminating beam in order to return the beam along an axis at right angles to the axis of the illuminating beam and the high-magnification observation system being further provided with a mirror for returning the beam to the high-magnification objective, wherein the second semitransparent plate is placed at the intersection of the axis of the lateral channel and the axis of the illuminating beam, the orientable mirror being placed at the intersection of the axes of the return beams reflected from the plates.

6. A microanalyzer according to claim 1, wherein the mechanically-controlled optical device comprises a lens associated with the illumination device for enlarging the optical field at the time of observation with low magnification, said lens being withdrawn at the time of observation with high magnification.

* * * * *